US006691073B1

(12) United States Patent
Erten et al.

(10) Patent No.: US 6,691,073 B1
(45) Date of Patent: Feb. 10, 2004

(54) ADAPTIVE STATE SPACE SIGNAL SEPARATION, DISCRIMINATION AND RECOVERY

(75) Inventors: Gamze Erten, Okemos, MI (US); Fathi M. Salam, Okemos, MI (US)

(73) Assignee: Clarity Technologies Inc., Troy, MI (US)

( * ) Notice: Subject to any disclaimer, the term of this patent is extended or adjusted under 35 U.S.C. 154(b) by 0 days.

(21) Appl. No.: 09/701,920

(22) PCT Filed: Jun. 16, 1999

(86) PCT No.: PCT/US99/13550

§ 371 (c)(1), (2), (4) Date: Feb. 9, 2001

(87) PCT Pub. No.: WO99/66638

PCT Pub. Date: Dec. 23, 1999

Related U.S. Application Data

(60) Provisional application No. 60/089,750, filed on Jun. 18, 1998.

(51) Int. Cl.⁷ .............................................. H04B 15/00
(52) U.S. Cl. ........................... 702/190; 702/39; 702/54; 702/74; 702/190; 702/197; 700/28; 700/44; 700/73; 700/173; 381/94.1; 381/99; 379/390.02; 379/390.03; 379/386; 379/388.06; 367/43; 367/45; 367/56; 367/129
(58) Field of Search ............................... 702/39, 54, 56, 702/66, 67, 70, 74, 110, 113, 124, 126, 183, 189, 190, 194, 196, 197, FOR 103, 104, 109, 134, 164, 170, 171; 706/14–18, 22, 26, 31; 381/94.1, 94.2, 94.3, 99; 379/390.02, 390.03, 390.01, 386, 388.06; 708/3, 5–9, 300, 303–309, 311, 315, 316, 520, 525, 530, 607, 819, 821; 700/28, 44, 45, 47, 48, 53, 67, 73, 75, 173, FOR 101, 102

(56) References Cited

U.S. PATENT DOCUMENTS

| 5,140,670 | A | | 8/1992 | Chua et al. ..................... 395/24 |
| 5,208,786 | A | | 5/1993 | Weinstein et al. .......... 367/124 |
| 5,355,528 | A | | 10/1994 | Roska et al. ................... 395/24 |
| 5,383,164 | A | | 1/1995 | Sejnowski et al. ............. 67/134 |
| 5,539,832 | A | | 7/1996 | Weinstein et al. ............. 381/94 |
| 5,706,402 | A | | 1/1998 | Bell ............................. 395/23 |
| 6,185,309 | B1 | * | 2/2001 | Attias ......................... 381/94.1 |
| 6,389,445 | B1 | * | 5/2002 | Tsividis ...................... 708/819 |

FOREIGN PATENT DOCUMENTS

| WO | WO98/58450 | 12/1998 | .......... H03H/21/00 |
| WO | WO99/66638 | 12/1999 | .......... H03H/21/00 |

OTHER PUBLICATIONS

Marven et al., A Simple Approach to Digital Signal Processing, 1996, John Wiley & Sons, Inc., pp. 90–102.*

Gilbert, State Space and ARMA Models: An Overview of the Equivalence, Mar. 1993, pp. 1–26.*

E. Weinstein, et al.; Multi–Channel Signal Separation by Decorrelation; IEEE Transactions on Speech and Audio Processing, vol. 1, No. 4, Oct. 1993 pp. 405–413.

C. Jutten and J. Herault; Blind Separation of Sources, Part 1: An adaptive algorithm based on neuromimetic architecture; Signal Processing, vol. 24, No. 1, Jul. 1991, pp. 1–10.

C. Jutten and J. Herault; Blind Separation of Sources, Part II: Problems Statement; Signal Processing, vol. 24, No. 1, Jul. 1991, pp. 11–20.

F.M. Salam; An Adaptive Network for Blind Separation of Independent Signals; Proceedings of the 1993 IEEE International Symposium on Circuits and Systems (ISCAS) vol. 1, pp. 431–434.

A. Chihocki, et al.; Adaptive Approach to Blind Source Separation with Cancellation of Additive and Convolutional Noise; 3rd. International Conference on Signal Processing; 1996, vol. 1; pp 412–415.

A.J. Bell, et al.; Blind Separation and Blind Deconvolution; An Information–Theoretic Approach; 1995 International Conference on Acoustics, Speech, and Signal Processing; ICASSP–95; vol. 5; pp. 3415–3418.

G. Erten and F. Salam; Real Time Separation of Audio Signals Using Digital Signal Processors; MWSCAS 1997 Sacramento, California; IEEE 1997; pp 1237–1240.

FM Salam and G. Erten; Blind Signal Separation and Recovery in Dynamic Environments; NSIP 97 Workshop; Mackinac Island, Michigan, USA, in Sep. 1997.

Hoang–Lan Nguyen Thi and Christian Jutten; "Blind Source Separation for Convolutive Mixtures"; Signal Processing European Journal Devoted to the Methods and Applications of Signal Processing; vol. 45, No. 2; Aug. 1, 1995; pp. 209–229.

G. Erten and F. Salam; "Two Cellular Architectures for Integrated Image Sensing and Processing on a Single Chip"; Journal of Circuits, Systems and Computers, vol. 8, Nos. 5 & 6; 1998, pp. 637–659.

G. Erten and F. Salam; "Modified Cellular Neural Network Architecture for Integrated Image Sensing and Processing"; Proceedings of the 1999 IEEE International Symposium on Circuits and Systems, vol. 5, Orlando, Florida, May 30–Jun. 2, 1999; pp. 120–123.

\* cited by examiner

*Primary Examiner*—Marc S. Hoff
*Assistant Examiner*—Elias Desta
(74) *Attorney, Agent, or Firm*—Brooks Kushman P.C.

(57) ABSTRACT

This invention unifies a set of statistical signal processing, neuromorphic systems, and microelectronic implementation techniques for blind separation and recovery of mixed signals. A set of architectures, frameworks, algorithms, and devices for separating, discriminating, and recovering original signal sources by processing a set of received mixtures and functions of said signals are described. The adaptation inherent in the referenced architectures, frameworks, algorithms, and devices is based on processing of the received, measured, recorded or otherwise stored signals or functions thereof. There are multiple criteria that can be used alone or in conjunction with other criteria for achieving the separation and recovery of the original signal content from the signal mixtures. The composition adopts both discrete-time and continuous-time formulations with a view towards implementations in the digital as well as the analog domains of microelectronic circuits. This invention focuses on the development and formulation of dynamic architectures with adaptive update laws for multi-source blind signal separation/recovery. The system of the invention seeks to permit the adaptive blind separation and recovery of several unknown signals mixed together in changing interference environments with very minimal assumption on the original signals. The system of this invention has practical applications to non-multiplexed media sharing, adaptive interferer rejection, acoustic sensors, acoustic diagnostics, medical diagnostics and instrumentation, speech, voice, language recognition and processing, wired and wireless modulated communication signal receivers, and cellular communications.

This invention also introduces a set of update laws and links minimization of mutual information and the information maximization of the output entropy function of a nonlinear neural network, specifically in relation to techniques for blind separation, discrimination and recovery of mixed signals. The system of the invention seeks to permit the adaptive blind separation and recovery of several unknown signals mixed together in changing interference environments with very minimal assumption on the original signals.

31 Claims, 10 Drawing Sheets

ADAPTIVE STATE SPACE SIGNAL SEPARATION, DISCRIMINATION AND RECOVERY

RELATIONSHIP TO APPLICATIONS

This application is a U.S. National Stage filing of International Application No. PCT/US99/13550, filed Jun. 16, 1999, which claims priority to U.S. Provisional Application No. 60/089,750, filed June 18, 1998.

BACKGROUND OF THE INVENTION

1. Field of the Invention

This invention pertains to systems for recovering original signal information or content by processing multiple measurements of a set of mixed signals. More specifically the invention pertains to adaptive systems for recovering several original signals from received measurements of their mixtures. In order to understand the problem solved by the invention, and the approach of the prior art to solve this problem, the following problem statement is helpful: With reference to FIG. 1 of the attached drawings, consider N independent signals $s_1(t), \ldots,$ and $S_N(t)$. These signals may represent any of, or a combination of, independent speakers or speeches, sounds, music, radio-based or light based wireless transmissions, electronic or optic communication signals, still images, videos, etc. These signals may be delayed and superimposed with one another by means of natural or synthetic mixing in the medium or environment through which they propagate. One consequently desires an architecture, framework, or device 20 that, upon receiving the delayed and superimposed signals, works to successfully separate the independent signal sources using a set of appropriate algorithms and procedures for their applications.

2. Discussion of Related Art

The recovery and separation of independent sources is a classic but difficult signal processing problem. The problem is complicated by the fact that in many practical situations, many relevant characteristics of both the signal sources and the mixing media are unknown.

Two main categories of methods are used:

1. Neurally inspired adaptive algorithms (e.g., U.S. Pat. Nos. 5,383,164 and 5.315,532), and
2. Conventional discrete signal processing (e.g., U.S. Pat. Nos. 5,208,786 and 5.539,832).

Neurally inspired adaptive arhitectures and algorithms follow a method originally proposed by J. Herault and C. Jutten, now called the Herault-Jutten (or HJ) algorithm. The suitability of this set of methods for CMOS integration have been recognized. However, the standard HJ algorithm is at best heuristic with suggested adaptation laws that have been shown to work mainly in special circumstances. The theory and analysis of prior work pertaining to the HJ algorithm are still not sufficient to support or guarantee the success encountered in experimental simulations. Herault and Jutten recognize these analytical deficiencies and they describe additional problems to be solved. Their proposed algorithm assumes a linear medium and filtering or no delays. Specifically, the original signals are assumed to be transferred by the medium via a matrix of unknown but constant coefficients. To summarize, the Herault-Jutten method (i) is restricted to the full rank and linear static mixing environments, (ii) requires matrix inversion operations, and (iii) does not take into account the presence of signal delays. In many practical applications, however, filtering and relative delays do occur. Accordingly, previous work fails to successfully separate signals in many practical situations and real world applications.

Conventional signal processing approaches to signal separation originate mostly in the discrete domain in the spirit of traditional digital signal processing methods and use the statistical properties of signals. Such signal separation methods employ computations that involve mostly discrete signal transforms and filter/transform function inversion. Statistical properties of the signals in the form of a set of cumulants are used to achieve separation of mixed signals where these cumulants are mathematically forced to approach zero. This constitutes the crux of the family of algorithms that search for the parameters of transfer functions that recover and separate the signals from one another. Calculating all possible cumulants, on the other hand, would be impractical and too time consuming for real time implementation.

The specifics of these methods are elaborated in these categories below.

1. Neurally Inspired Architectures and Algorithms for Signal Separation

These set of neurally inspired adaptive approaches to signal separation assume that the "statistically independent" signal vector $S(t)=[s_1(t), \ldots,$ and $s_N(t)]^T$ is mixed to produce the signal vector $M(t)$. The vector $M(t)$ is received by the sensors (e.g, microphones, antenna, etc.).

Let the mixing environment be represented by the general (static or dynamic) operator $\Im$. Then, $$M(t)=\Im(S(t)) \quad \text{Equation (1)}$$

There are several formulations that can be used to invert the mixing process, i.e., operator $\Im$ in a "blind" fashion where no apriori knowledge exists as to the nature or content of the mixing operator $\Im$ or the original sources $S(t)$. We group these into two categories, static and dynamic. Additional distinctions can be made as to the nature of the employed adaptation criteria, e.g., information maximization, minimization of high order cumulants, etc.

1.1. The Static Case

The static case is limited to mixing by a constant nonsingular matrix. Let us assume that the "statistically independent" signal vector $S(t)=[s_1(t), \ldots,$ and $s_N(t)]^T$ is mixed to produce the signal vector $M(t)$. Specifically, let the mixing operator $\Im$ be represented by a constant matrix A, namely $$M(t)=AS(t) \quad \text{Equation (2)}$$

In FIG. 2, two architectures that outline the modeling of the mixing and the separation environments and processes are shown. The architecture in FIG. 2(a) necessarily computes the inverse of the constant mixing matrix A, which requires that A is invertible, i.e., $A^{-1}$ exists.

The alternate architecture in FIG. 2(b) does not impose this restriction in that upon convergence the off diagonal elements of the matrix D are exactly those of the off diagonal elements of the matrix A. In this case, however, diagonal elements of the matrix A are restricted to equal "1.0." By setting the diagonal elements of D to zero, one essentially concludes that the mixing process is invertible even if the mixing matrix is not.

In both cases, $S(t)$ is the set of unknown sources, $M(t)$ is the set of mixtures, $U(t)$ is the set of separated signals that estimate $S(t)$, and $Y(t)$ is the set of control signals used to update the parameters of the unmixing process. As shown in FIG. 2, the weight update utilizes a function of the output $U(t)$.

In the first case, we labeled the unmixing matrix W, and in the second case we labeled it D. Note that D has zero diagonal entries. The update of the entries of these two matrices is defined by the criteria used for signal separation, discrimination or recovery, e.g., information maximization, minimization of higher order cumulants, etc.

As an example, one possible weight update rule for the case where $$U(t)=WM(t) \quad \text{Equation (3)}$$

could be $$\dot{w}_{ij}=\eta[W^{-T}+g''(u)/g'(u)M^{T}]_{ij} \quad \text{Equation (4)}$$

where η is sufficiently small, g is an odd function, and M is the set of mixtures, U is the set of outputs which estimate the source signals, subscript T denotes transpose, and −T denotes inverse of transpose. Note that the function g( ) plays an additional role in the update which can be related to the above diagram as $$Y(t)=g(U(t)) \quad \text{Equation (5)}$$

One uses Equation (4) to update the entries of W in Equation (3). Through this is an iterative update procedure, the entries of W converge so that the product WA is nearly equal to the identity matrix or a permutation of the identity matrix.
On the other hand, in the second case, one potentially useful rule for the update of the D matrix entries $d_{ij}$ is generically described as $$\dot{d}_{ij}=\eta f(u_i(t))g(u_j(t)) \quad \text{Equation (6)}$$

where η is sufficiently small. In practice some useful functions for f(·) include a cubic function, and for g(·) include a hyperbolic tangent function. When using this procedure, one computationally solves for U(t) from Equation (7) below $$U(t)=[I+D]^{-1}M(t) \quad \text{Equation (7)}$$

at each successive step and sample point. This computation is a potentially heavy burden, especially for high dimensional D.

1.2. The Dynamic Case

The dynamic mixing model accounts for more realistic mixing environments, defines such environment models and develops an update law to recover the original signals within this framework.

In the dynamic case, the matrix A is no longer a constant matrix. In reference to the feedback structure of the static example, it is simpler to view Equation (7) where $U(t)=[I+D]^{-1}M(t)$ as an equation of the fast dynamic equation $$\tau\dot{U}(t)=-U(t)-DU(t)+M(t) \quad \text{Equation (8)}$$

This facilitates the computation by initializing the differential equation in Equation (8) from an arbitrary guess. It is important however to ensure the separation of time scales between Equations (8) and the update procedure like the one defined by Equation (6). This may be ensured by making η in Equation (6) and τ in Equation (8) sufficiently small.

If we assume the dimensionality of M(t) is N, a set of differential equations that define the dynamic signal separation algorithm can be written as $$\tau_i \dot{u}_i = -u_i - \sum_{j \neq i} D_{ij} u_j + m_i \quad \text{Equation (9)}$$

for $i = 1, \cdots, N$

This enumerates N differential equations. In addition, the adaptation process for the entries of the matrix D can be defined by multiple criteria, e.g., the evaluation of functions f( ) and g( ) in Equation (6). FIG. 3 is a pictorial illustration of the dynamic model in feedback configuration.

Current methods outline little in the way of procedures for the application of adaptation criteria within the architectures defined thus far. Two implied procedures have been noted:

First is the application of the signal separation functions, adaptation procedures and criteria to arbitrary points of data—regardless of whether each of these points is practically and physically accessible or not. Thus, the adaptive separation procedure applies the adaptation functions and criteria to each element of the measured mixed signals individually and instantaneously, after which appropriate parameter updates are made.

The second type of procedure has been described in FIG. 2(a) that uses Equation (3). In this case, the criteria is applied to the entire data set, or selected data points from the entire data set. Thus, the related adaptation process does not progress per sample, but utilizes the whole data set over which a constant, static mixing matrix is assumed to apply. Although this method is somewhat more robust than the first, it is essentially an off-line method not suitable for real time signal separation. Furthermore, when the assumption of a static constant matrix is incorrect, the accuracy of the unmixing process suffers.

1.3. Feedforward State Space

The architecture is shown in FIG. 7. Let the n-dimensional source signal vector be s, and the m-dimensional measurement vector be M. The mixing environment may be described by the Linear Time-Invariant (LTI) state space:

$$\dot{\bar{X}}=\bar{A}\bar{X}+\bar{B}s M=\bar{C}\bar{X}+\bar{D}s \quad \text{Equation (10)}$$

The parameter matrices $\bar{A}, \bar{B}, \bar{C}$ and $\bar{D}$ are of compatible dimensions. This formulation encompasses both continuous-time and discrete-time dynamics The dot on the state $\bar{X}$ means derivative for continuous-time dynamics, it however means "advance" for discrete-time dynamics. The mixing environment is assumed to be (asymptotically) stable, i.e., the matrix $\bar{A}$ has its eigenvalues in the left half complex plane. The (adaptive) network is proposed to be of the form $$\dot{X}=AX+BMy=CX+DM, \quad \text{Equation (11)}$$

where y is the n-dimensional output, X is the internal state, and the parameter matrices are of compatible dimensions. For simplicity, assume that X has the same dimensions as $\bar{X}$. FIG.(7) depicts the feedforward form of this framework.

The first question is the following: Does there exist parameter matrices A, B, C, and D which would recover the original signals? The answer now follows.

Existence of Solutions to the Recovery Problem

We state that the (adaptive) dynamic network would be able to counter act the mixing environment, if the network parameters are set at (or attain via an adaptive scheme) the following values:

$$A = A^* = T(\bar{A} - \bar{B}[D]\bar{C})T^{-1} \quad \text{Equation (12)}$$

$$B = B^* = T\bar{B}[D] \quad \text{Equation (13)}$$

$$C = C^* = -[D]\bar{C}T^{-1} \quad \text{Equation (14)}$$

$$D = D^* = [D] \quad \text{Equation (15)}$$

where [D] equals $D^{-1}$: the inverse of D, if m=n, $(\overline{D^T D})^{-1} D^{-T}$; a pseudo-inverse, if m>n, and $D^{-T}(\overline{DD^T})^{-1}$: a pseudo-inverse if m<n.

The matrices A*, B*, and C* can take on a family of values due to the nonsingular state-equivalent transformation T. We shall use T to render the network architecture "canonical" or simple from a realization view point. This formulation in effect generalizes the formulations in the literature, which are limited to FIR filters, predominantly for 2-dimensional sources and two measurements, into general n-dimensional sources, and m-dimensional measurements. Note that, this modeling includes the FIR filtering models, and extends to IIR filtering if A is nonzero.

While this feedforward form for the adaptive network is viable, we note a limitation for its applicability, namely, that the parameters of the mixing environment have to be such that the matrix A* is (asymptotically) stable. That is, for a stable mixing environment, the composite matrix of the adaptive network $$A^* = \bar{A} - \bar{B}[D]\bar{C} \quad \text{Equation (16)}$$

must be (asymptotically) stable, i.e., has its eigenvalues in the left half complex plane. It is apparent that this requirement places a limiting condition on the allowable mixing environments which may exclude certain class of applications!

2. The Transfer Function Based Approach to Signal Separation

The representation of signal mixing and separation by transfer functions makes this approach a dynamic environment model and method.

Current methods thus define a structure for separating two signals by processing two mixture measurements, which was illustrated in FIG. 4.

Other architectures for the separation functions in the transfer function domain results in three serious shortfalls which are all impediments to the design and implementation of a practical method and apparatus. First, this formulation, as expressed, precludes the generalization of the separation procedure to higher dimensions, where the dimensionality of the problem exceeds two. In other words, a practical formalization of the separation method does not exist when there are more than two mixtures and two sources. One can illustrate this by direct reference to other approaches, where matrix multiplication terms are written out, so that each scalar equation defines one of the entries of the resulting product matrix desired to be equal to zero. Since permutations of a diagonal matrix are also allowed, multiple sets of equations are created. For a two mixture problem, this results in two pairs (four total) of equations, each with two product terms. Beyond that the number of equations increases. To be precise the number of equations needed to describe the number of equations for a specific permutation of the N dimensional case is equal to ($N^2$-N). For the two dimensional problem this value is 2.

Second, the inversion procedure for the transfer function is ad hoc and no recipe or teaching exists. The impact of dimensionality plays a crucial role in this. It is apparent from the method that the resulting architecture gives rise to networks requiring transfer components whose order is dependent on products of the transfer components of the mixing environment. Thus, one can not design a network architecture with a fixed order.

Third, the initial conditions can not be defined since the formulation is not in the time domain and can not be initialized with arbitrary initial conditions. Hence, the method is not suitable for real time or on line signal separation.

SUMMARY OF THE INVENTION

The present invention describes a signal processing system for separating a plurality of input signals into a plurality of output signals, the input signals being composed of a function of a plurality of source signals being associated with a plurality of sources, the output signals estimating the source signals or functions of source signals. The system comprises a plurality of sensors for detecting the input signals, an architecture processor for defining and computing a signal separation method, the signal separation method delimiting a signal separation architecture for computing the output signals, and an output processor for computing the output signals based on the signal separation method or architecture.

BRIEF DESCRIPTION OF THE DRAWINGS

FIG. 2(a). A static neural network structure for signal separation. U(t) approximates S(t). Y(t) is used for weight update of the network.

FIG. 2(b) An alternate static neural network structure for signal separation. U(t) approximates S(t). Y(t) is used for weight update of the feedback network.

DETAILED DESCRIPTION OF THE INVENTION

Figure 1:
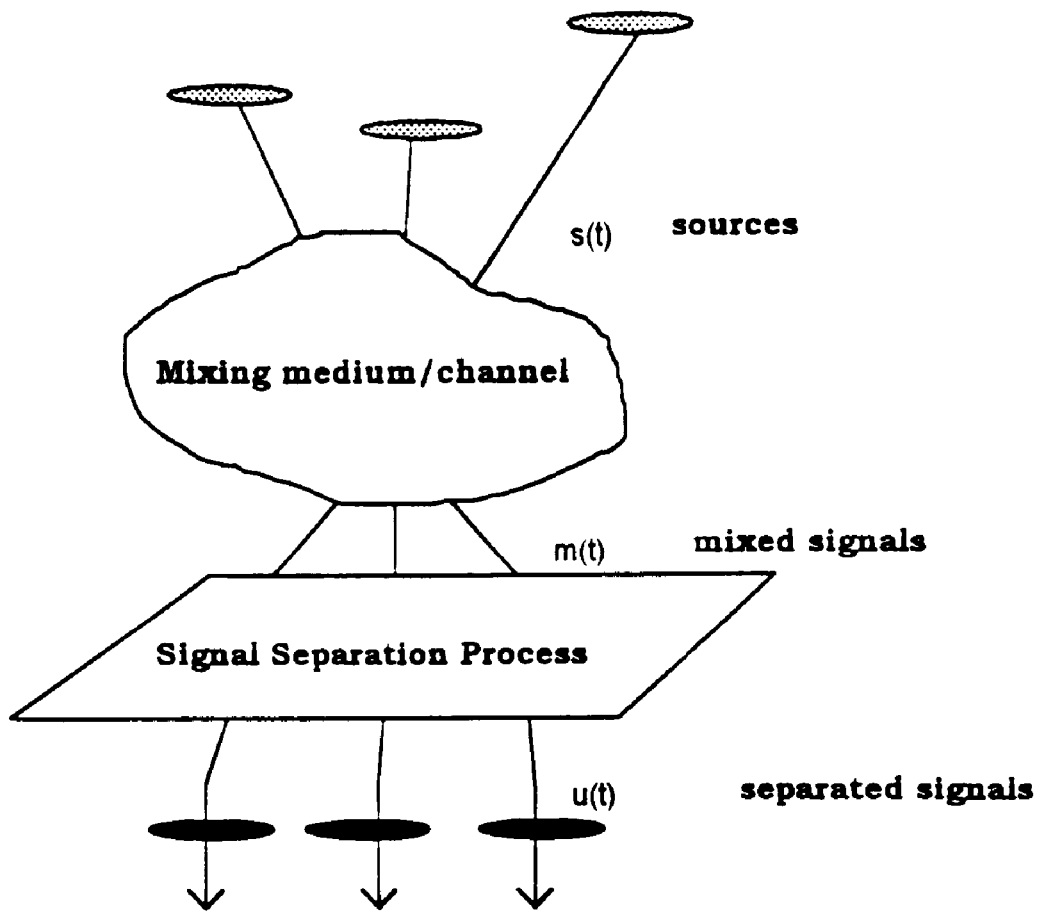
FIG. 1. Signal separation, discrimination and recovery problem statement.
Figure 2:
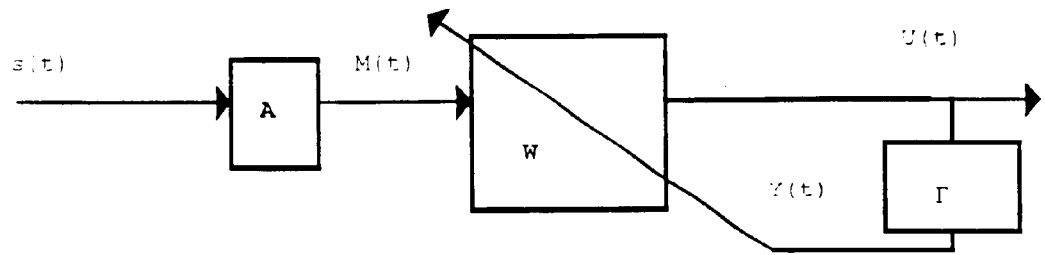
FIG. 2. Architecture of the signal separation and recovery network in case of static mixing by matrix A. U(t) is the output which approximates the original source signals s(t). Y(t) contain the values that are used in updating the parameters of the unmixing processes, i.e., W in (a) and D in (b).
Figure 2:
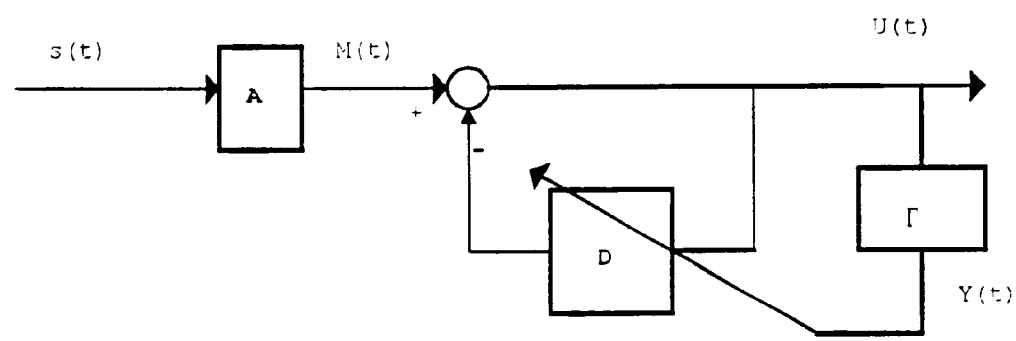
Figure 3:
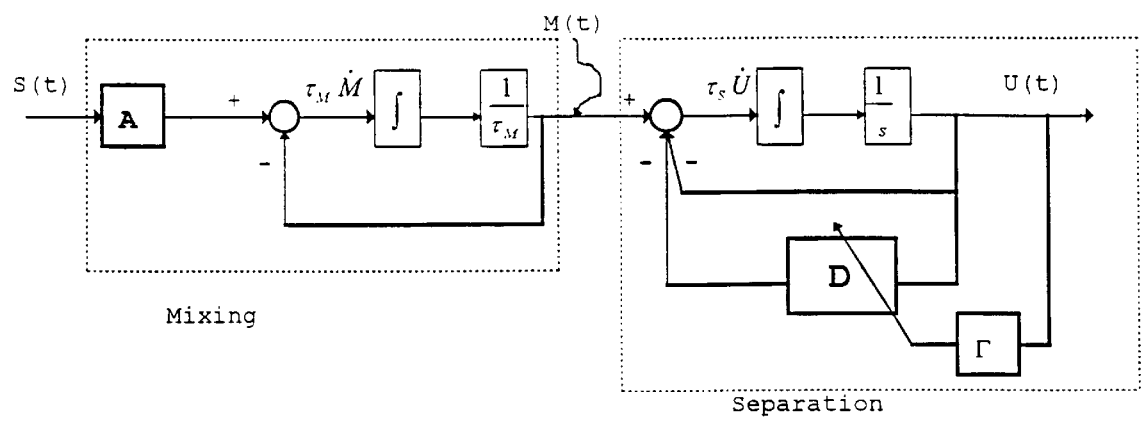
FIG. 3. Architecture of the signal separation and recovery network in case of feedback dynamic mixing and separation models. U(t) approximates S(t). The function g defines the criteria used for weight update of the feedback network.
Figure 4:
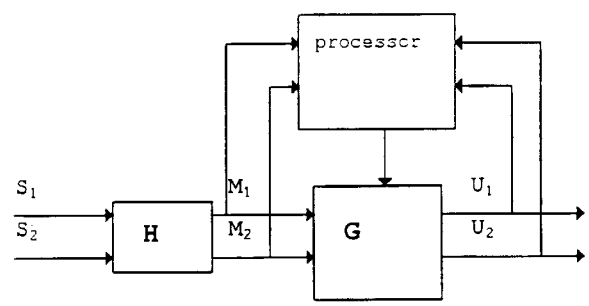
FIG. 4. (a) Conventional transfer function representation for signal mixing and separation for a two signal system. The two signals $U_1$ and $U_2$ approximate S1 and S2. G inverts the mixing process modeled as H. (b) The method is described only in two dimensions. The computation procedure and is neither practical nor extendible in the case of higher dimensional signals. Furthermore, the extension of the mixing environment to transfer function domain has also eliminated the time domain nature of the signals. This also causes the exclusion of the initial conditions from the set of equations.
Figure 4:
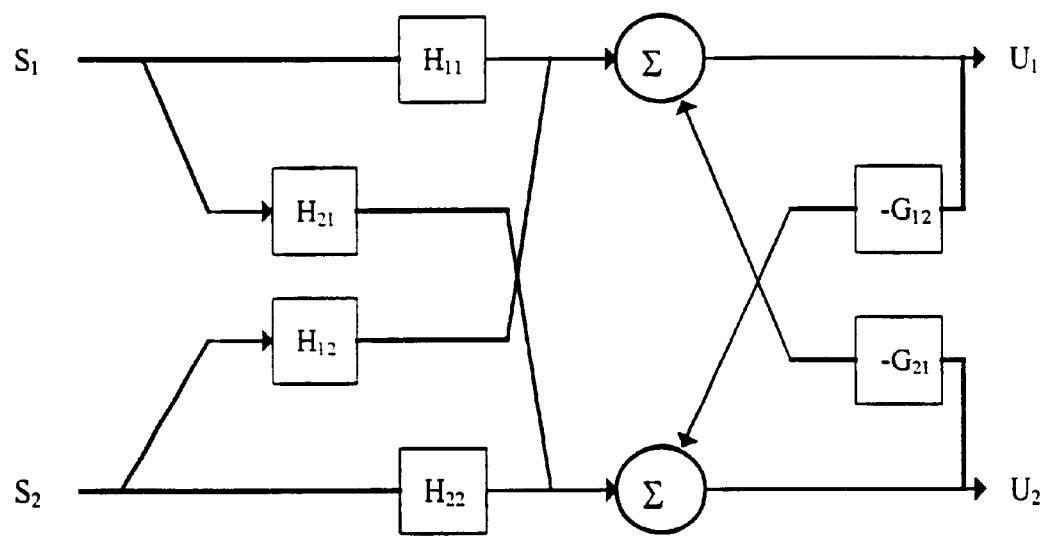
Figure 5:
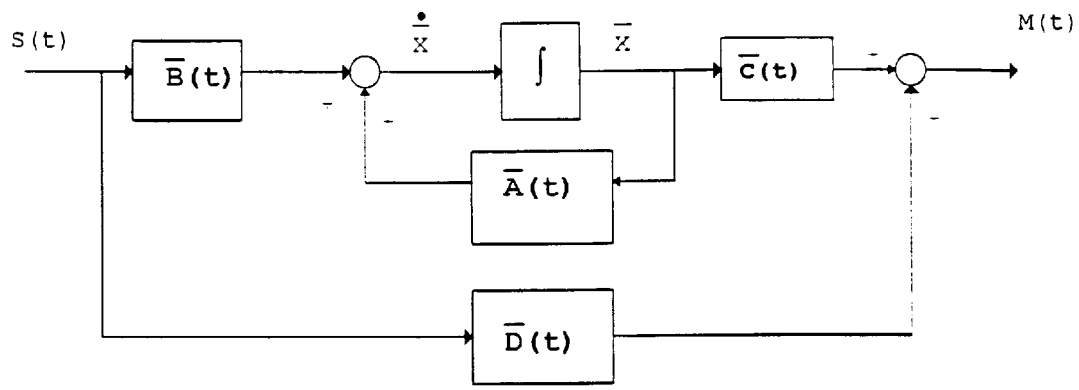
FIG. 5. Two mixing models for the state space time domain architecture. (a) General framework. (b) Special case where $\bar{A}$ and $\bar{B}$ are fixed, and its relation to conventional signal processing. Both models apply to multiple types of separation architectures.
Figure 5:
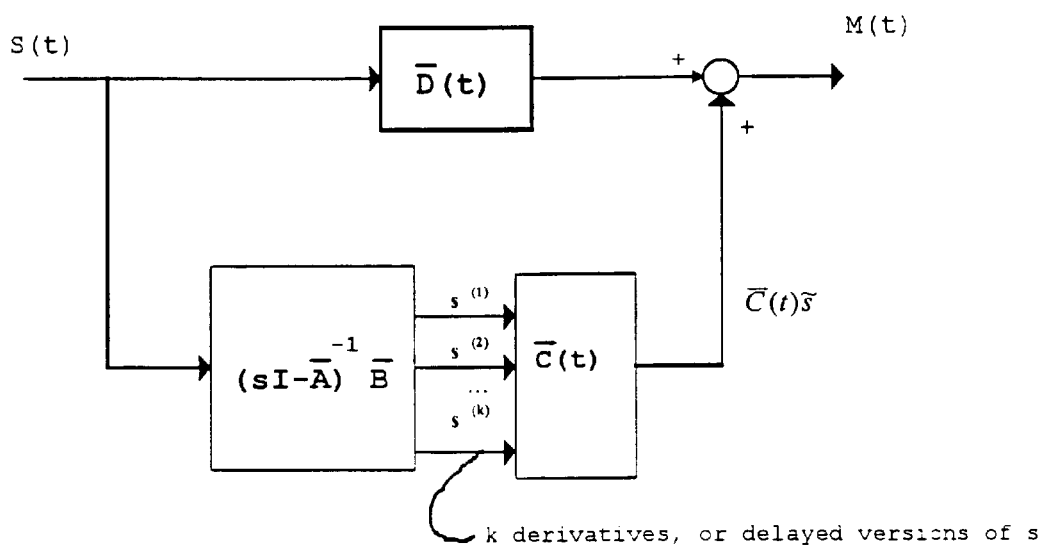
Figure 6:
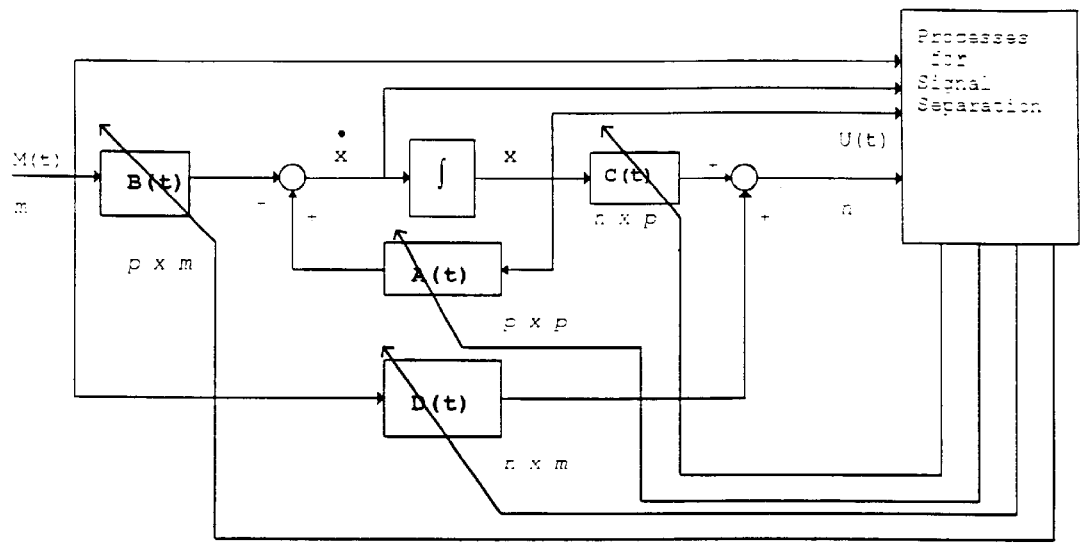
FIG. 6. Signal separation model for the state space time domain architecture. (a) General model and architecture. (b) Special case, only the model is shown without the arrows in (a) which depict parameter update procedures.
Figure 6:
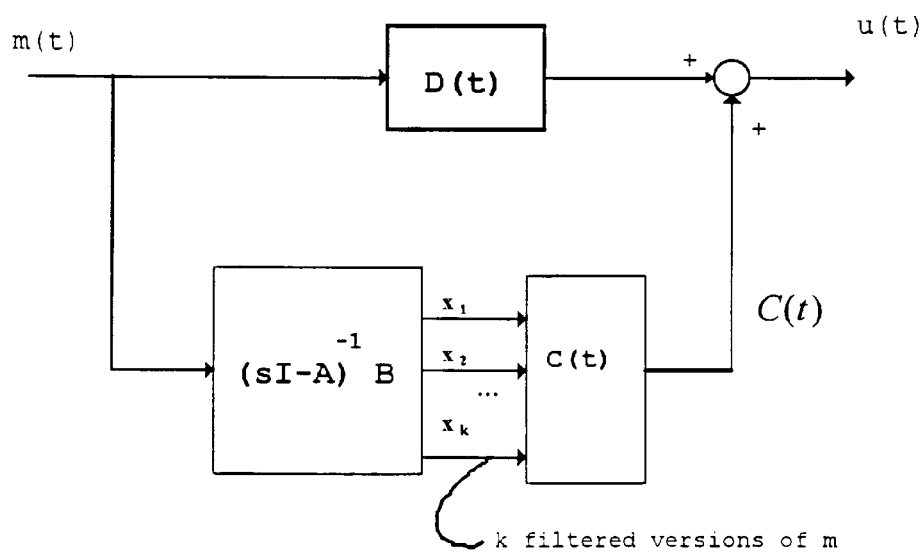

The present invention seeks to recover and separate mixed signals transmitted through various media wherein the separation of signals is of such high quality as to substantially increase (i) the signal carrying capacity of the medium or channel, (ii) the quality of the received signal, or (iii) both. The media or channels may include a combination of wires, cables, fiber optics, wireless radio or light based frequencies or bands, as well as a combination of solid, liquid, gas particles, or vacuum.

The present invention also seeks to separate mixed signals through media or channel wherein a high quality of signal separation is achieved by hardware currently available or produceable by state of the art techniques.

The system of this invention introduces a set of generalized frameworks superior to the described preexisting approaches for coping with a range of circumstances unaddressed to date. Specifically, the feedback state space architecture shown in FIG. 8 and its continuous and discrete renditions are described. Moreover, the architecture is mapped onto a set of adaptive filters in both FIR and IIR form, commonly used by those skilled in the art of digital signal processing. In addition, many functions and procedures for the adaptive computation of parameters pertinent to the architectures of this invention are outlined. Both the architectures and the procedures for adaptive computation of parameters are designed for achieving on-line real time signal separation, discrimination and recovery. The most practically pertinent shortfalls of many other techniques, namely the failure to account for multiple or unknown number of signals in the mixing, noise generation, changing mixing conditions, varying signal strength and quality, and some nonlinear phenomena are addressed by the formulations of this invention. The invented method overcomes the deficiencies of other methods by extending the formulation of the problem to include two new sets of architectures and frameworks, as well as a variety of parameter adaptation criteria and procedures designed for separating and recovering signals from mixtures.

Introduction

This invention presents a framework that addresses the blind signal separation and recovery (or de-convolution) in dynamic environments. The original work was motivated by the work of Herault and Jutten and Comon. Most of the recent results have focused primary on establishing analytical foundation of the results reported by Herault, Jutten and Kullback. Several researchers have used a host of analytical tools that include applied mathematics, statistical signal processing, system theory, dynamical systems and neural networks. The challenge still exists in generalizing the environment to more general dynamic systems.

Several theoretical results and formulations address the blind separation and recovery of signals in dynamic environments. We consider state space dynamic models to represent the mixing environment and consequently the adaptive network used to perform the signal separation and recovery. We employ dynamic models which are easily, and directly, adapted to discrete as well as continuous time channels. The presented environment model and the adaptive network allow for the case when the mixing environment includes (state) feedback and memory. The feedback of the state/output corresponds to Infinite Impulse Response (IIR) filtering in the discrete-time case, where as the feedforward corresponds to the FIR formulation.

The emphasis of our method is in developing the network architecture, and the improved convergent algorithms, with a view towards efficient implementations. An improved approximation of the (nonlinear) mutual information/ entropy function is used in order to ensure whitening and also to eliminate the assumption of output unit covariance. The improved expansion produces an odd polynomial in the network outputs which includes a linear term, as well as higher order terms—all absent from the expansion in other methods. It should be noted however, that some work has addressed only the static case where the mixing environment is represented by a constant matrix. Specifically, a formulation for an FIR filter was also converted into a static matrix mixing problem.

Method Summary

Figure 9:
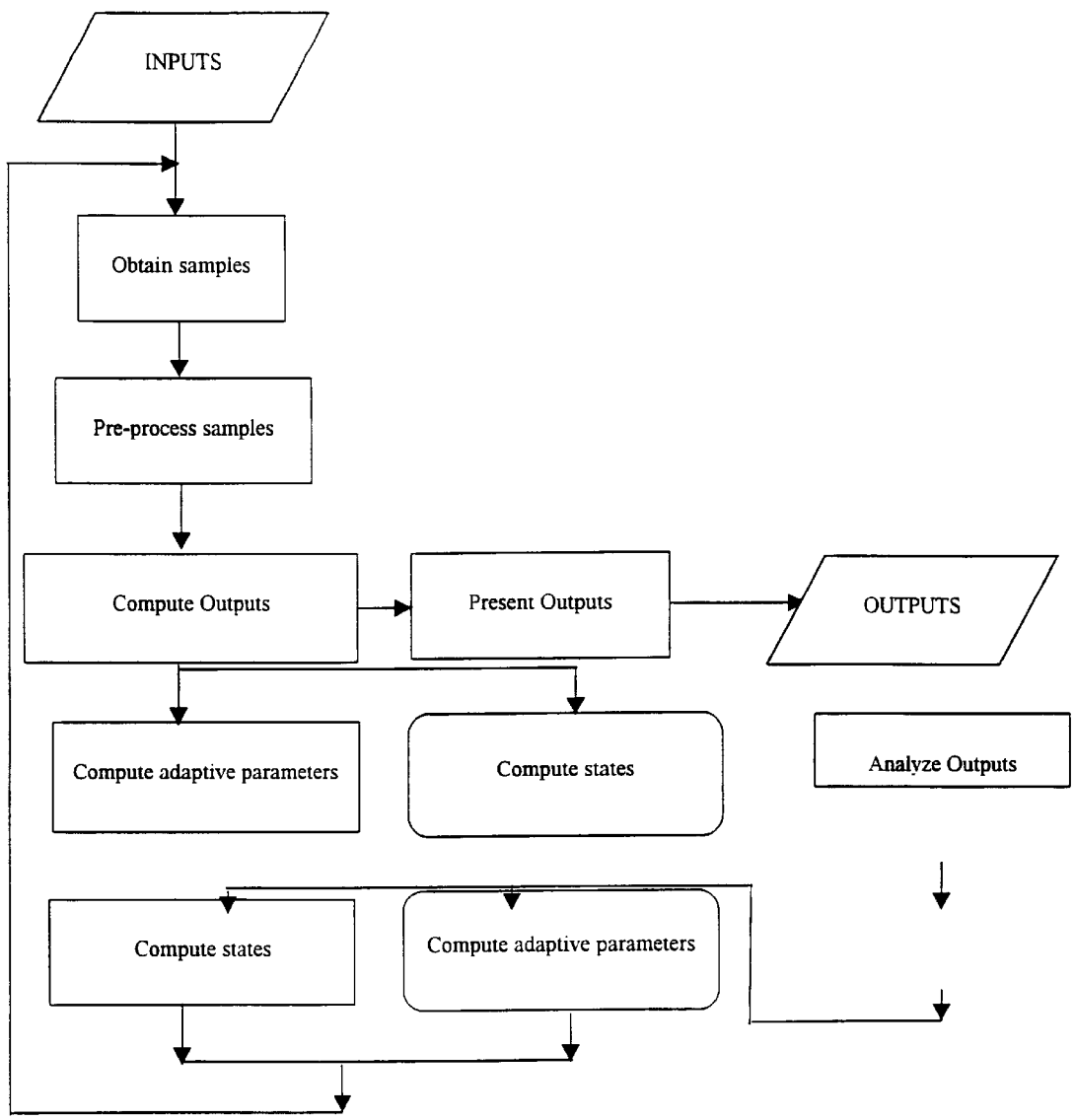
FIGS. 9. (a) Flowchart of the method of the present invention. (b) DSP implementation architecture. AID stands for analog to digital conversion, and D/A for digital to analog conversion. The internals of the DSP may include a variety of functional units as shown below. Different configurations are possible depending on the nature of the application, number of mixtures, desired accuracy, etc.
Figure 9:
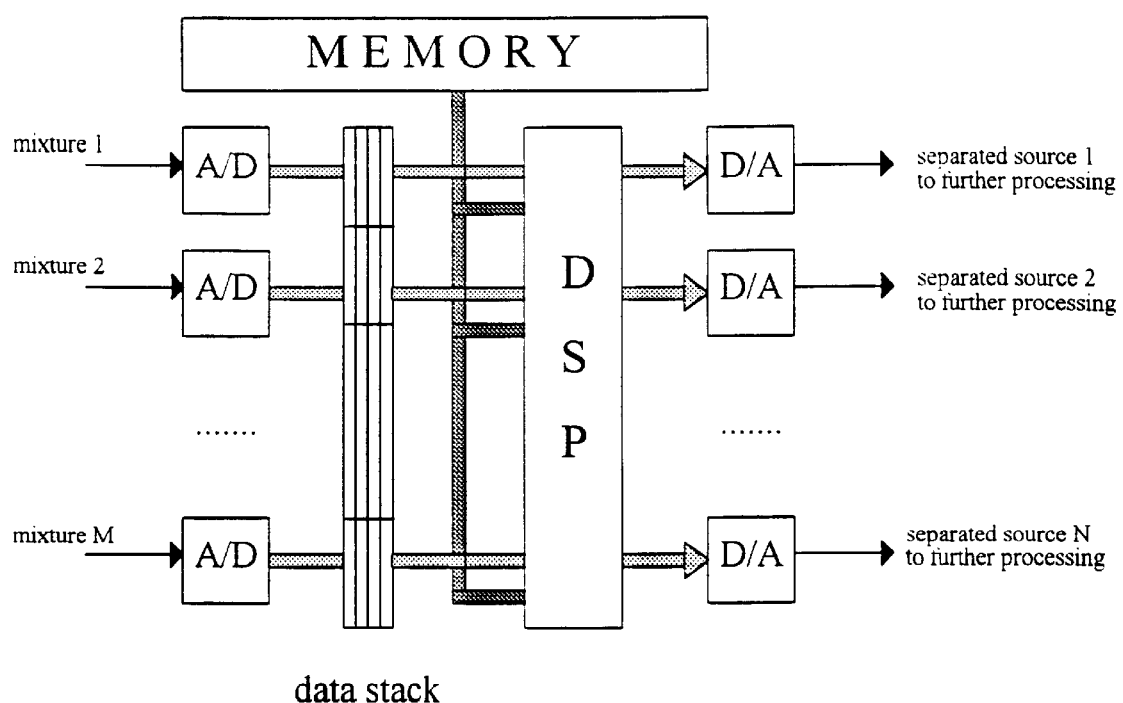
Figure 10:
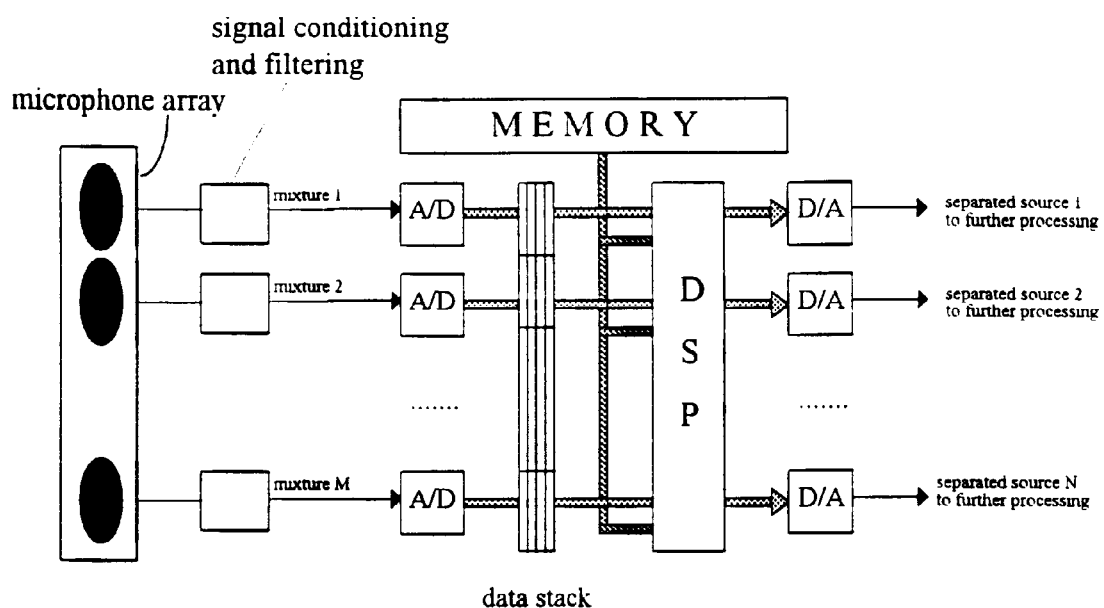
FIG. 10. Audio application based on the signal separation and recovery procedures of this invention. Audio signals are converted electrical signals by the elements of the microphone array. Each element of the microphone array receives a different version (or mixture) of the sounds in the environment. Different arrangements of microphone elements can be designed depending on the nature of the application, number of mixtures, desired accuracy, and other relevant criteria. Following some signal conditioning and filtering, these mixture signals are converted from analog format to digital format, so that they can be stored and processed. The digital signal processor of the system is programmed in accordance with the procedures for signal separation and recovery procedures of this invention. The internals of the DSP may include a variety of functional units for various arithmetic and logic operations, and digital representation, data storage and retrieval means to achieve optimum performance. Circuits and structures shown in figure may undergo further integration towards realization of the whole system on a single to chip.

FIG. 9(a) shows a process flow diagram of a method of the present invention. This includes (1) obtaining samples, (2) pre-processing of the samples. (3) computing outputs using the present value of the states or adaptive parameters, (4) computing adaptive parameters, (5) computing internal states, and storing and/or presenting of outputs.

Obtaining samples includes obtaining the multi channel data recorded through multiple sensors, e.g., microphones. Such data could also come from previously recorded outputs of said multiple sensors or mixtures thereof, e.g., mixed tracks of sounds. Data can be sampled on line for a real time or near real time process, or be recalled from a storage or recording media, e.g., tape, hard disk drive, etc.

Preprocessing of the samples include various processing techniques for manipulation of the obtained samples, including but not limited to up or down sampling to vary the effective sampling rate of data, application of various frequency filters, e.g., low, high, or band pass filters, or notch filters, linear or nonlinear operations between sensor outputs of the present or previous samples, e.g., weighted sum of two or more sensors, buffering, random, pseudorandom or deterministic selection and buffering, windowing of sampled data or functions of sampled data, and various linear and nonlinear transforms of the sampled data.

Computing outputs uses the states and parameters computed earlier. It is also possible delay this step until after the computation of adaptive parameters or after the computation of the internal states, or both. Moreover, alternately, outputs could be computed twice per sample set.

Computing of adaptive parameters may involve a method or multiple methods which use the derivatives of a function to compute the value of the function, the function defining the constraints imposed on the adaptive parameters. One or more such constraints can be used. A variety of methods and criteria specifically for computation of adaptive parameters are outlined in the present invention.

Computing of internal states involves invoking the structure of the architecture, along with the current or available values of adaptive parameters. The internal states may be in the form of a vector of states, scalar states, their samples in time, or their derivatives. The particular architecture defines the number of states.

Dynamic Architectures

Dynamic models encompass and describe more realistic environments. Both feedforward and feedback architectures of the state space approach can be implemented. Feedforward linear state space architecture was listed above. Throughout this description, we shall refer to the mathematical model for signal mixing as the mixing environment, while we refer to the mathematical model for the signal recovery as the (adaptive) network.

The method of this invention extends the environment to include more realistic models beyond a constant matrix, and develops successful update laws. A crucial first step is to include dynamic linear systems of the state space which are more general than FIR filters and transfer functions due to the inclusion of feedback and variations in initial conditions. Moreover, these models lend themselves to direct extension to nonlinear models. Another motivation of this work is to enable eventual implementation in analog or mixed mode micro-electronics.

The formulation addresses the feedback dynamic structures, where the environment is represented by a suitable realization of a dynamic linear system.

The Feedforward Linear Structure

Figure 7:
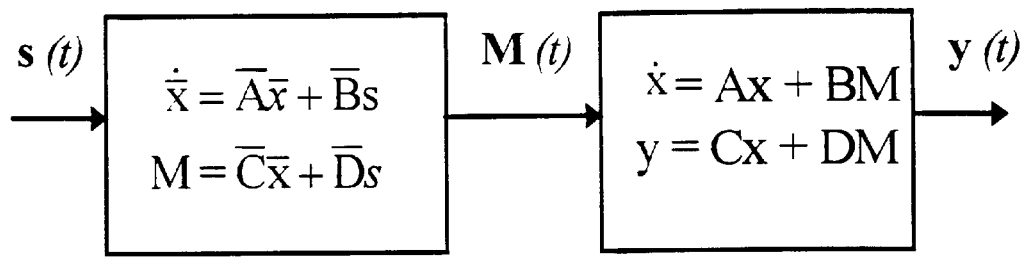
FIG. 7. Feedforward state space architecture.

The feedforward state space architecture was described in the introduction section and illustrated in FIG. 7.

The Feedback Linear Structures

Figure 8:
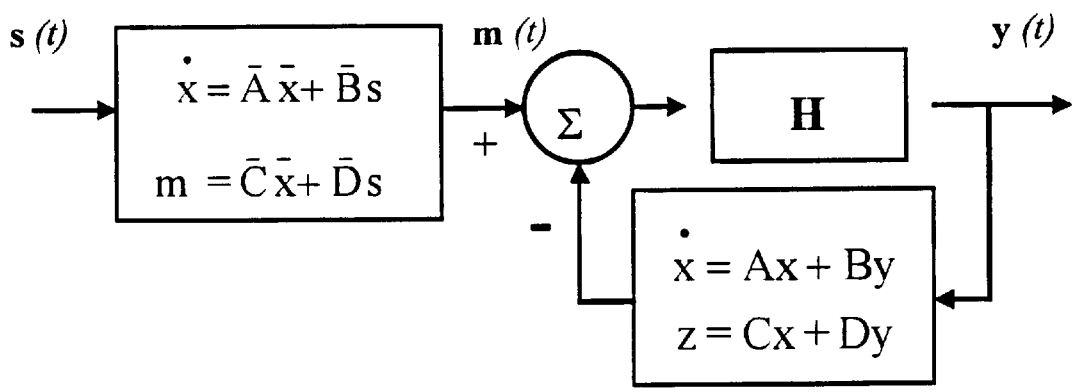
FIG. 8. Feedback state space architecture.

A more effective architecture than its feedforward precursor is the so-called (output) feedback network architecture, see FIG. 8. This architecture leads to less restrictive conditions on the network parameters. Also, because of feedback, it inherits several known attractive properties of feedback systems including, robustness to errors and disturbances, stability, and increased bandwidth. These gains will become apparent from the following equations Existence of Solutions to the Recovery Problem If y is to converge to a solution proportional (via a permutation matrix P) to s, namely, y=Ps, then, the following parameter matrices of the (adaptive) network will constitute a solution that recovers the original signals:

$$A = A^* = T\tilde{A}T^{-1}$$

$$B = B^* = T\tilde{B}P^{-1}$$

$$C = C^* = \tilde{C}T^{-1}$$

$$D = D^* = \tilde{D}P^{-1} - H$$

In addition to the expected desired properties of having feedback in the architecture of the network, we also achieve simplicity of solutions to the separation/recovery of signals. In this case, the architecture is not introducing additional constraints on the network. Note that H in the forward path of the network may in general represent a matrix in the simplest case, or a transfer function of a dynamic model. Furthermore, in the event that m=n, H may be chosen to be the identity matrix.

The elements of the procedure and its advantages are now apparent. Further generalizations of the procedures for developing the architectures can also account for non-minimum phase mixing environments. These steps are straightforward application of the above procedure and hence will not be elaborated upon.

An important generalization is to include nonlinearity as part of the architecture—explicitly. One model is to include nonlinearity as a static mapping of the measurement variable M(t). In this event, the adaptive network needs to include a compensating nonlinearity at its input stage. Thus, the input must include an "inverse-type" nonlinearity to counter act the measurement prior to further processing. This type of mixing environment is encountered in wireless applications that include satellite platforms.

The dynamic architecture defined in this proper way ensures that a solution to the blind signal separation does exist. We now move to the next step of defining the proper adaptive procedure/algorithm which would enable the network to converge to one of its possible solutions. Consequently, after convergence, the network will retain the variable for signal processing/recovery.

Discrete State Space Representation and Specialization to Discrete-time IIR and FIR Filters Performance Measure/Functional The mutual information of a random vector y is a measure of dependence among its components and is defined as follows:

In the Continuous Case:

$$L(y) = \int_{y \in Y} p_1(y) \ln \left| \frac{p_y(y)}{\prod_{j=1}^{j=r} p_y(y_j)} \right| dy$$

In the Discrete Case:

$$L(y) = \sum_{y \in Y} p_y(y) \ln \left| \frac{p_y(y)}{\prod_{j=1}^{j=r} p_y(y_j)} \right|$$

An Approximation of the Discrete Case:

$$L(y) \cong \sum_{k=k_0}^{k_1} p_y(y(k)) \ln \left| \frac{p_y(y(k))}{\prod_{j=1}^{j=r} p_y(y_j(k))} \right|$$

where $p_y(y)$ is the probability density function (pdf) of the random vector y, whereas $p_{y_j}(y_j)$ is the probabilty density of the j-th component of the output vector v. The functional L(y) is always non-negative and is zero if and only if the components of the random vector y are statistically independent. This important measure defines the degree of dependence among the components of the signal vector. Therefore, it represents an appropriate functional for characterizing (the degree of) statistical independence. L(y) can be expressed in terms of the entropy $$L(y) = -H(y) + \sum_i H(y_i)$$

where $H(y) := -E[\ln f_y]$, is the entropy of y, and $E[\cdot]$ denotes the expected value.

The General Nonlinear Discrete Time Non-stationary Dynamic Case

The Environment Model

Let the environment be modeled as the following nonlinear discrete-time dynamic (forward) processing model:

$$X_p(k+1) = f_p^k(X_p(k), s(k), w_1^*)$$

$$m(k) = g_p^k(X_p(k), s(k), w_2^*)$$

where $s(k)$ is an n-dimensional vector of original sources, $m(k)$ is the m-dimensional vector of measurements, $X_p(k)$ is the $N_p$-dimensional state vector. The vector (or matrix) $w_1^*$ represents constant/parameter of the dynamic equation, and $w_2^*$ represents constant/parameter of the "output" equation. The functions $f_p(\cdot)$ and $g_p(\cdot)$ are differentiable. It is also assumed that existence and uniqueness of solutions of the differential equation are satisfied for each set of initial conditions $X_p(t_0)$ and a given waveform vector $s(k)$.

The Processing Networks

The (processing) network may be represented by a dynamic (forward) network or a dynamic feedback network. The Feedforward Network is $$X(k+1) = f^k(X(k), m(k), w1)$$

$$y(k) = g^k(X(k), m(k), w2)$$

where k is the index, $m(k)$ is the m-dimensional measurement, $y(k)$ is the r-dimensional output vector, $X(k)$ is the N-dimensional state vector. (Note that N and $N_p$ may be different.) The vector (or matrix) $w_1$ represents the parameter of the dynamic equation, and $w_2$ represents the parameter of the "output" equation. The functions $f(\cdot)$ and $g(\cdot)$ are differentiable. It is also assumed that existence and uniqueness of solutions of the differential equation are satisfied for each set of initial conditions $X(t_0)$ and a given measurement waveform vector $m(k)$.

Update Law for the Discrete-time Dynamic Network: General Nonlinear Case

The update law is now developed for dynamic environments to recover the original signals. The environment here is modeled as a linear dynamical system. Consequently, the network will also be modeled as a linear dynamical system.

The network is a feedforward dynamical system. In this case, one defines the performance index $$J_0(w_1, w_2) = \sum_{k=k_0}^{k_1-1} L^k(y_k)$$

subject to the discrete-time nonlinear dynamic network $$X_{k+1} = f^k(X_k, m_k, w_1), X_{k_0}$$

$$y_k = g^k(X_k, m_k, w_2)$$

It noted that this form of a general nonlinear time varying discrete dynamic model includes both the special architectures of multilayered recurrent and feedforward neural networks with any size and any number of layers. It is more compact, mathematically, to discuss this general case but its direct and straightforward specialization to feedforward and recurrent (feedback) models is strongly noted.

Then, the augmented cost function to be optimized becomes $$J'_0(w_1, w_2) = \sum_{k=k_0}^{k_1-1} L^k(y_k) + \lambda_{k+1}^T (f^k(X_k, m_k, w_1) - X_{k+1})$$

The Hamiltonian is then defined as $$H^k = L^k(y(k)) + \lambda_{k+1}^T f^k(X, m, w_1)$$

Consequently, the sufficient conditions for optimality are:

$$X_{k+1} = \frac{\partial H^k}{\partial \lambda_{k+1}} = f^k(X_k, m_k, w_1)$$

$$\lambda_k = \frac{\partial H^k}{\partial X_k} = (f_{X_k}^k)^T \lambda_{k+1} + \frac{\partial L^k}{\partial X_k}$$

$$\Delta w_1 = -\eta \frac{\partial H^k}{\partial w_1} = -\eta (f_{w_1}^k)^T \lambda_{k+1}$$

$$\Delta w_2 = -\eta \frac{\partial H^k}{\partial w_2} = -\eta \frac{\partial L^k}{\partial w_2}$$

The boundary conditions are as follows: the first equation, the state equation, uses an initial condition, while the second equation, the co-state equation, uses a final condition equal to zero. The parameter equations use initial values with small norm which may be chosen randomly or from a given set.

General Discrete Linear Dynamic Case

Environment $$\bar{X}_p(k+1) = \bar{A}\bar{X}_p(k) + \bar{B}s(k)$$

$$m(k) = \bar{C}\bar{X}_p(k) + \bar{D}s(k)$$

Feedforward Network $$X(k+1) = AX(k) + Bm(k)$$

$$y(k) = CX(k) + Dm(k)$$

The first question is the following: Does there exist parameter matrices of the processing network which would recover the original signals? The answer is yes, the explicit solutions of the parameters are given next.

Existence of Solution to the Recovery Problem

The Update Law for the Linear Dynamic Case $$X_{k+1} = \frac{\partial H^k}{\partial \lambda_{k+1}} = f^k(X, m \cdot w_1) = AX_k + Bm_k$$

$$\lambda_k = \frac{\partial H^k}{\partial X_k} = (f_{X_k}^k)^T \lambda_{k+1} + \frac{\partial L^k}{\partial X_k} = A_k^T \lambda_k + C_k^T \frac{\partial L^k}{\partial y_k}$$

-continued $$\Delta A = -\eta \frac{\partial H^k}{\partial A} = -\eta (f_A^k)^T \lambda_{k+1} = -\lambda_{k+1} X_k^T$$

$$\Delta B = -\eta \frac{\partial H^k}{\partial B} = -\eta (f_B^k)^T \lambda_{k+1} = -\lambda_{k+1} m_k^T$$

$$\Delta D = -\eta \frac{\partial H^k}{\partial D} = -\eta \frac{\partial L^k}{\partial D} = \eta([D]^{-T} - f_\alpha(y) m^T)$$

$$\Delta C = -\eta \frac{\partial H^k}{\partial C} = -\eta \frac{\partial L^k}{\partial C} = \eta(-f_\alpha(y) X^T)$$

Specialization to IIR and FIR Filters

The general discrete-time linear dynamics of the network are given as:

$$X(k+1) = AX(k) + Bm(k)$$

$$y(k) = CX(k) + Dm(k)$$

where m(k) is the m-dimensional vector of measurements, y(k) is the n-dimensional vector of (processed) outputs, and X(k) is the (mL) dimensional states (representing filtered versions of the measurements in this case). One may view the state vector as composed of he L m-dimensional state vectors $X_1, X_2, \ldots, X_L$. That is, $$X_k = X(k) = \begin{bmatrix} X_1(k) \\ X_2(k) \\ \ldots \\ X_L(k) \end{bmatrix}$$

Special Case:

Consider the case where the matrices and A and B are in the "controllable canonical form." We represent the A and B block matrices as, $$A = \begin{bmatrix} A_{11} & A_{12} & \ldots & A_{1L} \\ I & 0 & \ldots & 0 \\ \ldots & I & \ldots & 0 \\ 0 & 0 & I & 0 \end{bmatrix}, \text{ and } B = \begin{bmatrix} I \\ 0 \\ \ldots \\ 0 \end{bmatrix}$$

where each block sub-matrix $A_{ij}$ may be simplified to a diagonal matrix, and each I is a block identity matrix with appropriate dimensions.
Then, $$X_1(k+1) = \sum_{j=1}^{L} A_{1j} X_j(k) + m(k)$$

$$X_2(k+1) = X_1(k)$$

$$\ldots$$

$$X_L(k+1) = X_{L-1}(k)$$

$$y(k) = \sum_{j=1}^{L} C_j X_j(k) + Dm(k)$$

This model represents an IIR filtering structure of the measurement vector m(k). In the event that the block matrices $A_{ij}$ are zero, then the model is reduced to the special case of an FIR filter.

$$X_1(k+1) = m(k)$$

$$X_2(k+1) = X_1(k)$$

$$\ldots$$

$$X_L(k+1) = X_{L-1}(k)$$

$$y(k) = \sum_{j=1}^{L} C_j X_j(k) + Dm(k)$$

The equations may be re-written in the well-known FIR form $$X_1(k) = m(k-1)$$

$$X_2(k) = X_1(k-1) = m(k-2)$$

$$\ldots$$

$$X_L(k) = X_{L-1}(k-1) = m(k-L)$$

$$y(k) = \sum_{j=1}^{L} C_j X_j(k) + Dm(k)$$

This last equation relates the measured signal m(k) and its delayed versions represented by $X_j(k)$, to the output y(k).
Special Canonical Representation Cases:

The matrices A and B are best represented in the "controllable canonical forms" or the form I format. That B is constant and A has only the first block rows as parameters in the IIR network case. In that event, No update equation for the matrix B are used. While for the matrix A only the first block rows are updated. Thus the update law for the matrix A is limited to $$\Delta A_{1i} = -\eta \frac{\partial H^k}{\partial A_{1i}} = -\left(\eta(f_{A_{1i}}^k)\right)^T \lambda_{k+1} = -\eta \lambda_1(k+1) X_i^T(k)$$

Noting the form of the matrix A, the co-state equations can be expanded as $$\lambda_1(k) = \lambda_2(k+1) + C_1^T \frac{\partial L^k}{\partial y_k}(k)$$

$$\lambda_2(k) = \lambda_3(k+1) + C_2^T \frac{\partial L^k}{\partial y_k}(k)$$

$$\vdots$$

$$\lambda_L(k) = C_L^T \frac{\partial L^k}{\partial y_k}(k)$$

$$\lambda_1(k+1) = \sum_{l=1}^{L} C_l^T \frac{\partial L^k}{\partial y_k}(k+l)$$

Therefore, the update law for the block sub-matrices in A are:

$$\Delta A_{1j} = -\eta \frac{\partial H^k}{\partial A_{1j}} = -\eta \lambda_1(k+1) X_j^T(k) = -\eta \sum_{l=1}^{L} C_l^T \frac{\partial L^k}{\partial y_k}(k+l) X_j^T$$

The $[D]^{-T}$ represents the transpose of the pseudo-inverse of the D matrix. The update laws for the matrices D and C can be elaborated upon as follows:

$$\Delta D = \eta([D]^{-T} - f_\alpha(y) m^T) = \eta(I - f_\alpha(y)(Dm)^T)[D]^{-T}$$

where I is a matrix composed of the r×r identity matrix augmented by additional zero row (if n>r) or additional zero columns (if n<r). In light of considering the "natural gradient," an alternate update law in this case is $$\Delta D = \eta([D]^{-T} - f_\alpha(y)m^T)D^T D = \eta(I - f_\alpha(y)(Dm)^T)D$$

For the C matrix, the update equations can be written for each block matrix as follows:

$$\Delta C_j = -\eta \frac{\partial H^k}{\partial C_j} = -\eta \frac{\partial L^k}{\partial C_i} = \eta(-f_\alpha(y)X_i^T)$$

If one reduces the state space by eliminating the internal state, one reduces the system to a static environment where $$m(t) = \overline{D}S(t)$$

In discrete notation it is defined by $$m(k) = \overline{D}S(k)$$

Two types of (discrete) networks have been described for separation of statically mixed signals. These are the feedforward network where the separated signals y(k) are $$y(k) = WM(k)$$

and feedback network where y(k) is defined as $$y(k) = m(k) - Dy(k)$$

$$y(k) = (I+D)^{-1}m(k)$$

Discrete update laws suggested for these are as follows
In case of the feedforward network, $$W^{t+1} = W^t + \mu\{-f(y(k))g^T(y(k)) + \alpha I\}$$

and in case of the feedback network, $$D^{t+1} = D^t + \mu\{f(y(k))g^T(y(k)) - \alpha I\}$$

where ($\alpha I$) may be replaced by time windowed averages of the diagonals of the $f(y(k))g^T(y(k))$ matrix.
Note: One may also use multiplicative weights in the update. The following "dynamic" FIR models can demonstrate analogous update law modifications.
Environment Model:
In an FIR, single delay case, the mixed samples m(k) are defined by the equation $$m(k) = \overline{D}_0 S(k) + D_1 S(k-1) = \sum_{i=0}^{1} \overline{D}_i S(k-i)$$

Separating Feedforward Network Model

This network produces approximated source signals y(k) defined by $$y(k) = \sum_{j=1}^{L} W_j M(k-j)$$

Using the update laws for matrices $W_0$ to $W_L$ as follows:

$$\Delta W_0 = \mu_0 \{\alpha I - f(y(k))g(y(k))^T\}$$

$$\Delta W_1 = -\mu_1 \{f(y(k))g(y(k-1))\}^T$$

or $$\Delta W_1 = -\mu_{t2}\{f(y(k))g(y(k-1))^T + \gamma f(y(k-1))g(y(k)^T\}$$

$$\Delta W_L = -\mu_L \left\{ f(y(k)) \left[ \sum_{l=1}^{L} g(y(k-l)^T) \right] \right\} \text{ or}$$

$$\Delta W_L = -\mu_L \left\{ f(y(k)) \left[ \sum_{l=1}^{L} g(y(k-l))^T \right] + \gamma \left[ \sum_{l=1}^{L} f(y(k-l)) \right] g(y(k)^T \right\}$$

A specific update can be performed simply by means of adding the rate of change $\Delta W$ to W as $$W^{t+1} = W^t + \Delta W$$

or by another known integration method for computing values of variables from their derivatives.

Continuous Time Models

This invention introduces a set of update laws and links minimization of mutual information and the information maximization of the output entropy function of a nonlinear neural network, specifically in relation to techniques for blind separation, discrimination and recovery of mixed signals. The system of the invention enables the adaptive blind separation and recovery of several unknown signals mixed together in changing interference environments with very minimal assumption on the original signals.

In the previous section, discrete time models were developed. This section deals primarily with continuous time derivations. These continuous system derivations parallel those in the discrete case and described here to complement the continuous time models. It is noted that continuous time and discrete time derivations in the content of this invention for the large part are analogous of each other. Updates laws of one domain can also be converted to update laws of the other domain by those skilled in the art.

Performance Measure/Functional

The mutual information of a random vector y is a measure of dependence among its components and is defined as follows:
In the continuous case:

$$L(y) = \int_{y \in Y} p_y(y) \ln \left| \frac{p_y(y)}{\prod_{j=1}^{j=r} p_{y_j}(y_j)} \right| dy$$

In the discrete case:

$$L(y) = \sum_{y \in Y}^{k} p_y(y) \ln \left| \frac{p_y(y)}{\prod_{j=1}^{j=r} p_{y_j}(y_j)} \right|$$

An Approximation of the Discrete Case:

$$L(y) \cong \sum_{k=k_0}^{k} p_y(y(k)) \ln \left| \frac{p_y(y(k))}{\prod_{j=1}^{j=r} p_{y_j}(y_j(k))} \right|$$

where $p_y(y)$ is the probability density function (pdf) of the random vector y, whereas $p_y(y_j)$ is the probabilty density of the j-th component of the output vector y. The functional L(y) is always non-negative and is zero if and only if the components of the random vector y are statistically independent. This important measure defines the degree of dependence among the components of the signal vector. Therefore, it represents an appropriate functional for characterizing (the degree of) statistical independence. L(y) can be expressed in terms of the entropy $$L(y) = -H(y) + \sum_i H(y_i)$$

where $H(y) := -E[\ln f_y]$, is the entropy of y, and $E[\cdot]$ denotes the expected value.

Derivation of the Update Law

Assume a linear feedforward structure of the neural network as shown below.

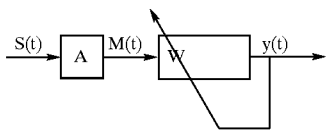

Then the probability density functions fo the (random vector) output and the mixed input variables are related as The mutual information of a random vector y is a measure of independence among its components and can be defined as:

$$f_y(u) = \frac{f_m(u)}{|W|}.$$

Thus, $$L(y) = -H(y) + \sum_i H(y_i)$$

can be written as $$L(y) = -H(M) - \ln|W| + \sum_i H(y_i)$$

To optimize (actually, minimize) L(y) as a function of W, knowledge (or approximation) of only the marginal entropies is required. Such information is not available, by hypothesis, and thus one needs to approximate these quantities in order to minimize L(y). Comon and Amari et, al. used respectively an Edgeworth and a Charlier-Gram expansion of the pdf's to approximate the marginal entropies. The approximation produces:

$$L(y) := \emptyset(M, y, W)$$

the derivations lead to the following gradient update rule $$\dot{W} = \eta[W^{-T} - f_a(y) M^T]$$

where functional approximation leads to a different function $f_a(y)$. Our work assumed a Charlier-Gram expansion and includes higher approximations than used previously. In our case, the function $f_a(y)$ is given by $$f_a(y) = \frac{71}{12} y^{15} - \frac{355}{12} y^{13} + \frac{190}{3} y^{11} - \frac{4033}{24} y^9 + \frac{941}{3} y^7 + \frac{47}{8} y^5 + y^3 + y$$

As an example, the algorithm defined by the previous two equations converges when a uniform random noise and sine function are applied as unknown sources. One can use the natural gradient to express the update law defined previously as $\dot{W} = \eta[W^{-T} - f_a(y) M^T]$ as $$\dot{W} = \eta[L - f_a(y) y^T] W$$

In this case, simulations show that such an algorithm converges for a variety of signals. However, it fails if a random and a sine waveforms were used. These results will also apply if some nonlinear functions are used. Hence, in this case, both functions have similar effects.

Parameter Update Techniques for Continuous Dynamic Environments

We consider more realistic environments, define their models and apply the update law to recover the original signals. In our formulation, the environment is modeled as linear dynamic system. Consequently, the network will also be modeled as a linear dynamic system.

The update law is now developed for dynamic environments to recover the original signals. The environment here is modeled as a linear dynamical system. Consequently, the network will also be modeled as a linear dynamical system.

The Feedforward Case

The network is a feedforward dynamical system as in FIG. 7. In this case, one defines the performance index $$J(x, w) = \int_0^T \mathcal{L}(t, x, \dot{x}, \lambda, w) dt$$

where $\mathcal{L}$ is the Lagrangian and is defined as $$\mathcal{L}(t, x, \dot{x}, \lambda, w) = \phi(t, x, w) + \lambda^T(\dot{x} - Ax - Be)$$

where $\lambda(t)$ is the adjoint state equation defined by $$\dot{\lambda} = -A^T \lambda + \frac{\partial \phi}{\partial x}$$

The functional $\phi$ may represent a scaled version of our measure of dependence I(y), w is a vector constructed of the rows of the parameter matrices C and D. Note that a canonical realization may be used so that B is constant. The matrix A, in the canonical representation, may have only N-parameters, where N is the dimension of the state vector X. The parameters, A, C, and D, represented generically by wp, will be updated using the general gradient descent form:

$$\dot{wp} = -\eta \frac{\partial \mathcal{L}}{\partial wp}$$

Therefore, using the performance index defined as $$I(y) = -H(y) + \sum_i H(y_i),$$

the matrices C and D are updated according to $$\dot{D}=\eta(I-f_a(y)y^T)D$$

$$\dot{C}=\gamma(I-f_a(y)x^T)C$$

where $f_a(\cdot)$ is given by a variety of nonlinear expansive odd-functions which include hyperbolic sine, and the inverse of a sigmiodal function.

In one specific computation/approximation, the function is given as $$f_a(y) = \frac{71}{12}y^{15} - \frac{355}{12}y^{13} + \frac{190}{3}y^{11} - \frac{4033}{24}y^9 + \frac{941}{3}y^7 + \frac{47}{8}y^5 + y^3 + y$$

The essential features in using the above equation for $f_a(y)$ are summarized as follows:

1. it is analytically derived and justified.
2. it includes a linear term in y and thus enables the performance of second order statistics necessary for signal whitening,
3. it contains higher order terms which emanate from the 4th order cumulant statistics in the output signal y, and
4. it does not make the assumption that the output signal has unity covariance.

The function for $f_a(y)$ represents the only function used in the literature to date with the above characteristics. This function, therefore, exceeds the limitations of the other analytically derived functions.

Computer simulations confirm that the algorithm converges if the function for $f_a(y)$ defined above is used.

The Feeback Architecture

The (output) feedback architecture of FIG. 8 may be simplified in realization with the following (canonical) state-space representation:

The Environment:

$$\dot{\overline{X}}_i = \overline{A}_i \overline{X}_i + \overline{B}_i \overline{S}, \ 1 \le i \le L$$

$$M = \sum_{i=1}^{L} \overline{C}_i \overline{X}_i + \overline{D}\,\overline{S}$$

The network:

$$\dot{X}_i = A_i X_i + B_i y, \ 1 \le i \le L$$

$$Z = \sum_{i=1}^{L} C_i X_i + Dy$$

$$y = M - Z$$

where each $\overline{X}_i$ represents a state vector of the environment of the same dimension as the source signals, and each $X_i$ represents a state of the network of the same dimension as the output signal. For simplicity, we assumed the same number, L, of the state vectors in both environment and network.

Now, using the performance index $$I(y) = -H(y) + \sum_i H(y_i),$$

the matrices $C_i$ and D are updated according to $$\dot{D}=\eta D(-I+f_a(y)y^T)$$

$$\dot{C}_i=\gamma C_i(-I+f_a(y)x^T)$$

A simpler update law which was verified to work in certain cases may be satisfactory in special applications:

$$\dot{D}=\eta f_a(y)y^T$$

$$\dot{C}_i=\gamma f_a(y)x_i^T$$

Computer simulations performed demonstrated the performance of the two equations above.

It should be clear that the states may, in the simple FIR filtering, represent simple delays of the sources, while the states in the network represent delays in the fed back output signals. However, this view is a simple consideration of the delays of the signal that occur in real physical applications. The framework, therefore, is more general since it may consider arbitrary delays including those of IIR filtering and continuous-time physical effects.

Observations

Connection to Information Maximization

One can rewrite the averaged mutual information in terms of the entropy of the output vector of a nonlinear network with a weight matrix followed by an activation function nonlinear. This view would link the about analytical approach with the information-maximization approach. To see the connection, we now proceed as follows. Using $$\left( f_y(u) = \frac{f_m(u)}{|W|} \cdot \right),$$

one can re-express the mutual information criterion as $$I(y) = E\left[ \ln \frac{f_M(u)}{|W|\prod_i f_{yi}(u_i)} \right]$$

$$\int f_{yc}(u) \ln \frac{f_M(u)}{|W|\prod_i f_{yi}(u_i)} du$$

One can now view the expression $$|W|\Pi f_{yi}(u_i)$$

as the Jacobian of a nonlinear (activation) function applied to the output vector components. Thus if we were to insert an activation function nonlinearity, following the linear mapping of the weight matrix, we would render the expression for $$I(y) = \int f_y(u) \ln \frac{f_y(u)}{\prod_i f_{yi}(u_i)} du$$

equals to $$I(y)=E[\ln f_y(u)]$$

Note that, in this last step, we took the liberty in using the same symbol f to stand for the unknown joint probability function of the vector output of the non linear activation function.

Thus now one can state that the minimization of $$I(y) = \int f_y(u) \ln \frac{f_y(u)}{\prod_i f_{yi}(u_i)} du$$

is equivalent to the minimization of $I(y)=E[\ln f_y(u)]$. One observes that minimizing the quantity $I(y)=E[\ln f_y(u)]$ is, by definition, equal to the maximization of the entropy function of the output of the nonlinear activation function. Note that the nonlinear activation function used is constructed so that its derivative is necessarily equal to the marginal probability distributions. Hence this establishes the exact link between the analytical approach pursued herein with other discussions. This bypasses the generally invalid assumptions made previously which assume that H(y|e)

does not depend on the weight matrix.

We note that the crux of the matter in the formulation is to determine an approximation to the marginal probability density functions. Such an approximation needs to rely on the statistical properties of the processed signals and justified by analytical means.

Stochastic Versus Deterministic Update

Two key points should be noted, One is that while the formulation adopts a stochastic functional, in the eventual implementation of the update laws, only deterministic functions of the output variable y are used. The second point is that the update laws of $\dot{W}=\eta[W^{-T}-f_a(y)M^T]$ or $\dot{W}=\eta[L-f_a(y)y^T]W$ are applied on line. In contrast, the application of the update laws described before are applied using a window and selecting random output samples to emulate the stochastic process in the update law.

Implementation of the Architectures and Update Laws

A direct hardware implementation of a practical extension of the HJ network to a first-order dynamic network has been reported previously with experimental results. Direct implementations represent an avenue of effective implementation of the architectures and algorithms for the fastest execution of the recovery network.

Another paradigm includes DSP architectures. For a DSP based emulation of the signal separation algorithm families discussed here, it will be up to the tradeoffs in a particular application to identify the best processor architecture and numerical representations, e.g., floating or fixed point. To achieve a highly integrated solution (e.g., one chip) will require embedding a DSP core either from a pre-designed device or designed from standard silicon cell libraries.

The compiler front-end to the DSP assembler and linker forms a direct bridge from a high level language coded algorithm simulation environment to DSP emulation. In addition, a similar direct link exists between many computing environments and the DSP emulation environments, for example, C/C++ library and compilers for various processors.

Programmable logic can be an integral part of the related development process. A programmable DSP core (a DSP processor that is designed for integration into a custom chip) can be integrated with custom logic to differentiate a system and reduce system cost, space, and power consumption.

What is claimed is:

1. An acoustic signal discrimination system for discriminating at least one input signal M into at least one output signal Y, the at least one input signal comprising at least one function of at least one source signal affected by a medium, the at least one source signal associated with at least one source, the at least one output signal estimating the at least one source signal, the system comprising:

a processor for defining and computing a plurality of parameters of a signal separation architecture, the architecture comprising a feedback state space representation establishing a relationship between the input signals and the output signals as $\dot{X}_i = A_i X_i + B_i Y$ for $1 \leq i \leq L$ $$Z = \sum_{i=1}^{L} C_i X_i + DY$$

$U = M - Z$ where $X_i$ represents a state vector of the medium, L is a number of state vectors, $A_i$ and $B_i$ are state update matrices, Y is a function of U, and $C_i$ and D are matrices updated according to $\dot{C}_i = \gamma C_i(-I + f_a(Y)X^T)$ $\dot{D} = \eta D(-I + f_a(Y)Y^T)$ where I is an identity matrix, $\gamma$ and $\eta$ are constants, and $f_a(\cdot)$ is a non-linear odd function.

2. The acoustic signal discrimination system as in claim 1 further comprising at least one sensor for detecting the at least one input signal and an output processor for computing the at least one output signal.

3. The acoustic signal discrimination system as in claim 1 wherein $$f_a(y) = \frac{71}{12}y^{15} - \frac{355}{12}y^{13} + \frac{190}{3}y^{11} - \frac{4033}{24}y^9 + \frac{941}{3}y^7 - \frac{47}{8}y^5 + y^3 + y.$$

4. The acoustic signal discrimination system as in claim 1 wherein $f_a$ comprises a hyperbolic function.

5. The acoustic signal discrimination system as in claim 1 wherein $f_a$ comprises an inverse of a sigmoidal function.

6. The acoustic signal discrimination system as in claim 1 wherein the at least one input signal is received and stored.

7. The acoustic signal discrimination system as in claim 1 further comprising an update processor computing variable parameters of the signal separation architecture.

8. The acoustic signal discrimination system as in claim 1 further comprising an input signal processor for computing functions of the at least one input signal.

9. The acoustic signal discrimination system as in claim 1 further comprising an output signal processor for computing at least one function of the at least one output signal.

10. The acoustic signal discrimination system as in claim 1 wherein variable parameters of the signal separation architecture are computed based on the data from at least one of an input signal processor and an output signal processor.

11. The acoustic signal discrimination system as in claim 1 wherein the at least one sensor is a plurality of sensors generating a plurality of input signals, the plurality of sensors arranged in a sensor array having a directional response pattern.

12. The acoustic signal discrimination system as in claim 11 wherein the directional response pattern of the sensor array is based on signal processing of the input signals.

13. The acoustic signal discrimination system as in claim 1 wherein a quantity of the input signals and a quantity of the output signals are not equal.

14. The acoustic signal discrimination system as in claim 1 wherein at least one of the at least one output signal is a function of at least two source signals.

15. The acoustic signal discrimination system as in claim 1 wherein the at least one output signal comprises at least two output signals based on a function of a same source signal.

16. The acoustic signal discrimination system as in claim 1 wherein the feedback state space representation is mapped at least in part onto a finite impulse response (FIR) filter.

17. The acoustic signal discrimination system as in claim 1 wherein the state space representation is mapped at least in part onto an infinite impulse response (IIR) filter.

18. The acoustic signal discrimination system as in claim 1 wherein the state space representation is generalized to a nonlinear time variant function.

19. A method for separating a plurality of source signals comprising:
 receiving a plurality of input signals M; and
 computing a plurality of output signals, Y, the output signals estimating the source signals, the output signals based on parameters of a signal separation architecture;
 wherein the signal separation architecture comprises $$\dot{X}_i = A_i X_i + B_i Y \text{ for } 1 \leq i < L$$

$$Z = \sum_{i=1}^{L} C_i X_i + DY$$

$$U = M - Z$$

where $X_i$ represents a state vector of the environment, L is a number of state vectors, $A_i$ and $B_i$ are state update matrices, Y is a function of U, and $C_i$ and D are matrices updated according to $$\dot{C}_i = \gamma C_i(-I + f_a(Y)X^T)$$
$$\dot{D} = \eta D(-I + f_a(Y)Y^T)$$

where I is an identity matrix, $\gamma$ and $\eta$ are constants, and $f_a(\cdot)$ is a non-linear odd function.

20. The method for separating a plurality of source signals as in claim 19 wherein $$f_a(y) = \frac{71}{12}y^{15} - \frac{355}{12}y^{13} + \frac{190}{3}y^{11} - \frac{4033}{24}y^9 + \frac{941}{3}y^7 - \frac{47}{8}y^5 + y^3 + y.$$

21. The method for separating a plurality of source signals as in claim 19 wherein $f_a$ comprises a hyperbolic function.

22. The method for separating a plurality of source signals as in claim 19 wherein $f_a$ comprises an inverse of a sigmoidal function.

23. The method for separating a plurality of source signals as in claim 19 further comprising storing the input signals.

24. The method for separating a plurality of source signals as in claim 19 further comprising storing the output signals.

25. The method for separating a plurality of source signals as in claim 19 further comprising computing at least one from a set consisting of transforms of the input signals and analysis of the input signals.

26. The method for separating a plurality of source signals as in claim 19 further comprising computing at least one from a set consisting of transforms of the output signals and analysis of the output signals.

27. The method for separating a plurality of source signals as in claim 19 wherein the architecture is altered during execution of the method.

28. The method for separating a plurality of source signals as in claim 19 wherein zeros or a random set of numbers is used to initialize parameters.

29. The method for separating a plurality of source signals as in claim 19 further comprising using parameters previously computed by another method instance overlapped in time.

30. The method for separating a plurality of source signals as in claim 19 further comprising using parameters computed by a previously terminated method instance.

31. A method for discriminating at least one input signal M comprising:
 forming a signal separation architecture for determining at least one output signal, Y, the signal separation architecture comprising $$\dot{X}_i = A_i X_i + B_i Y \text{ for } 1 \leq i < L$$

$$Z = \sum_{i=1}^{L} C_i X_i + DY$$

$$U = M - Z$$

where $X_i$ represents a state vector of the medium, L is a number of state vectors, $A_i$ and $B_i$ are state update matrices, Y is a function of U, and $C_i$ and D are matrices updated according to $$\dot{C}_i = \gamma C_i(-I + f_a(Y)X^T)$$
$$\dot{D} = \eta D(-I + f_a(Y)Y^T)$$

where I is an identity matrix, $\gamma$ and $\eta$ are constants, and $f_a(\cdot)$ is a non-linear odd function; and
 determining the at least one output signal based on the signal separation architecture.

* * * * *

UNITED STATES PATENT AND TRADEMARK OFFICE
CERTIFICATE OF CORRECTION

PATENT NO.    : 6,691,073 B1
DATED         : February 10, 2004
INVENTOR(S)   : Gamze Erten et al.

It is certified that error appears in the above-identified patent and that said Letters Patent is hereby corrected as shown below:

Column 24,
Line 42, delete "medium" and insert therefor -- environment --.

Signed and Sealed this

Eighteenth Day of May, 2004

JON W. DUDAS
*Acting Director of the United States Patent and Trademark Office*